United States Patent [19]

Shimizu et al.

[11] Patent Number: 4,524,100

[45] Date of Patent: Jun. 18, 1985

[54] INORGANIC COMPOSITE AND THE PREPARATION THEREOF

[75] Inventors: Tadao Shimizu, Tachikawashi; Noriyuki Shimizu; Shoji Harada, both of Meguroku, all of Japan

[73] Assignee: Nikkan Industries Co., Ltd., Tokyo, Japan

[21] Appl. No.: 493,271

[22] Filed: May 10, 1983

[30] Foreign Application Priority Data

May 10, 1982 [JP] Japan .................................. 57-78028
May 10, 1982 [JP] Japan .................................. 57-78029

[51] Int. Cl.³ .............................................. B32B 5/16
[52] U.S. Cl. ..................................... 428/283; 264/60; 264/61; 428/288; 428/296; 428/325; 428/402; 428/426; 428/443
[58] Field of Search ............... 428/283, 288, 443, 402, 428/426, 538, 325, 296; 264/60, 61, 63

[56] References Cited

U.S. PATENT DOCUMENTS 3,212,960 10/1965 Quinn ..................... 428/443
3,598,693 8/1971 Andersen et al. ............ 428/443
4,376,675 3/1983 Perrota ..................... 418/296

*Primary Examiner*—James J. Bell
*Attorney, Agent, or Firm*—Cushman, Darby & Cushman

[57] ABSTRACT

There is prepared in inorganic composite containing a needle-like inorganic material or a fiber-like inorganic material which is present as a mixture in isotropic solid vitreous inorganic material while maintaining its needle-like or fiber-like structure. The inorganic composite is prepared by a process comprising the steps of kneading a mixture containing a vitreous inorganic material and a needle-like or fiber-like inorganic material which does not melt at the softening point of the vitreous material;

molding the mixture into a predetermined shape; and calcining the molded mixture at a temperature higher than the softening point of the vitreous inorganic material and below the melting point of said needle-like or fiber-like inorganic material.

24 Claims, No Drawings

INORGANIC COMPOSITE AND THE PREPARATION THEREOF

CROSS REFERENCE TO RELATED APPLICATIONS

The composite of the present invention can be employed in making the metal clad substrate for printed circuit boards of companion Shimizu et al application Ser. No. 493,270, filed May 10, 1983 entitled "Metal Clad Substrate For Printed Circuit Boards And The Method For Manufacturing The Same" based on Japanese priority applications Nos. 57-177993 of Oct. 9, 1982 and 57-78030 of May 10, 1982 and in making the board of companion Shimizu et al application Ser. No. 493,269, filed May 10, 1983 entitled "Board For Additive Circuits" based on Japanese priority application No. 57-177994 filed Oct. 9, 1982. The entire disclosures of the companion applications are hereby incorporated by reference and relied upon.

BACKGROUND OF THE INVENTION

1. Field of the Invention

The present invention relates to an inorganic composite suitable for electric insulation, and to a process for preparing the same.

2. Description of the Prior Art

Organic composites are predominantly employed as the material for electric insulation for superior productivity and mechanical workability thereof. Electric insulation of organic composites, however, is defective in heat resistance such that the insulation resistance and excellent dielectric characteristics at higher temperatures cannot be obtained, leading to a limited range of application. Electric insulation of inorganic materials is, on the other hand, heat-resistant and shows very little change in size due to heat and stable electric characteristics against temperature and humidity. However, some of the inorganic materials are defective: for example, mica is low in strength; alumina ceramics, zirconium ceramics and the like are inferior in mechanical workability in cutting punching works.

Heretofore, electric insulation of inorganic materials has been defective in that it was limited as to methods of molding and hence difficult to be molded into complicated shapes, that significant changes in the size occurred during the course of molding and calcination and that the manufacturing cost is high because higher calcination temperatures are required.

BRIEF SUMMARY OF THE INVENTION

1. Objects of the Invention

The primary object of the present invention is to provide an inorganic composite which:

(i) has a greater strength and mechanical workability suitable for punching and cutting works than prior materials;

(ii) has heat-resistance and electric stability against temperature and humidity; and (iii) has desirable electric characteristics such as insulation resistance and dielectric constant.

A second object of the present invention is to provide a process for preparing an inorganic composite which is capable of:

(i) determining the shape before calcining and molding the composite into complicated shapes, (ii) controlling the orientation of the needle-like or fiber-like inorganic material at the time of molding;

(iii) producing the final product at a high precision in respect of the designed size; and (iv) reducing the production cost by calcining the material at a lower temperature.

2. Features of the Invention

The first feature of the present invention lies in the inorganic composite containing needle-like or fiber-like inorganic material which is present in an isotropic solid vitreous material as a mixture while maintaining its needle-like or fiber-like structure.

The second feature of the present invention lies in the process for preparing the inorganic composite which comprises the steps of kneading a mixture of vitreous material and a needle-like or fiber-like inorganic material that does not melt at the softening point of the vitreous inorganic material; molding the mixture into a predetermined shape; and calcining the molded mixture at a temperature higher than the softening point of the vitreous inorganic material but below the melting point of the needle-like or fiber-like inorganic material.

The method of molding according to the present invention is preferably selected from any one of the molding methods of compression molding, roll molding, extrusion or injection molding.

The needle-like inorganic material is preferably calcium metasilicate.

The fiber-like inorganic material is preferably potassium titanate or magnesium silicate fibers.

It is possible to add a third material other than the needle-like or fiber-like inorganic material and the vitreous inorganic material to the mixture to be kneaded in the kneading step for improving the moldability or calcining performance or for varying the dielectric constant of the mixture.

DETAILED DESCRIPTION

The present invention will be explained in more detail. The needle-like inorganic material is a natural inorganic substance represented by calcium metasilicate. Calcium metasilicate is a needle-like substance containing the principal component as expressed by the chemical formula of $CaSiO_3$: the ratio of its length to the diameter is greater than 10:1. It is an inorganic substance which is light white and has needle-like crystalline structure. It has an excellent heat resistance with the melting point at about 1,500° C. and is obtainable at a low price equal to or less than that of glass powder. It is a natural substance. Wollastonite (manufactured by NYCO) is one example of natural needle-like calcium metasilicate.

The fiber-like inorganic material is an inorganic material represented by fibers of potassium titanate or of magnesium silicate. The fibers of potassium titanate are expressed by the chemical formula of $K_2O.nTiO_2$ or $K_2O.nTiO_2-mH_2O$ and are fibrous in shape having a diameter smaller than the diameter of the needle-like inorganic material of which ratio between the length and the diameter is greater than 10:1. It should be noted that the number represented above by the symbols n and m does not need to be an integer. A method for mass-producing such potassium titanate fibers at a lower cost has recently been developed and fibers with the ratio between the length and the diameter being greater than 1,000:1 can be easily obtained. Said fibers of potassium titanate may include the fiber of hydrated titanium oxide ($TiO_2.mH_2O$) which is obtained by treating potassium titanate fiber with acid and the fiber of titanium dioxide ($TiO_2$) as a derivative of potassium titanate which is obtained by calcining said hydrated titanium oxide. Molecules of water present in hydrated titanium oxide fibers as well as hydrated potassium titanate fibers are removed at the calcining stage and the resultant inorganic substances become stabilized.

As the derivative of potassium titanate fibers other than those mentioned above, there are fibrous barium titanate and fibrous strontium titanate which are synthesized by reacting potassium titanate fiber as the starting material with barium or strontium compounds.

The potassium titanate fiber is particularly superior in heat resistance and mechanical strength, has a melting point of about 1,300° C. and a tensile strength greater than glass fiber by about three-fold.

The type of vitreous material is selected depending on the use of the inorganic composite described below.

TABLE 1

| Composition | Type of Glass | | | | | Unit: wt % |
|---|---|---|---|---|---|---|
| | Glass A | Glass E | Glass C | Glass S | Glass D | Quarz Glass |
| $SiO_2$ | 71.6 | 54 | 62.5 | 64.3 | 73.4 | 99.99 |
| $Al_2O_3$ | 0.48 | 14 | 4 | 24.8 | 1.2 | <0.1 |
| CaO | 10.7 | 20 | } 17.5 | <0.01 | 1.0 | — |
| MgO | 2.02 | 3 | | 10.3 | 0.2 | — |
| $K_2O$ | 15.0 | 0.5 | 10 | 0.27 | 3.0 | — |
| $Fe_2O_3$ | 0.14 | — | — | 0.2 | — | — |
| $B_2O_3$ | — | 10.5 | 4.5 | <0.01 | 21.8 | — |

TABLE 2

| Properties | | Type of Glass | | | | | |
|---|---|---|---|---|---|---|---|
| | | Glass A | Glass E | Glass C | Glass S | Glass D | Quarz Glass |
| Mechanical Properties | | | | | | | |
| Specific Gravity | — | 2.50 | 2.54 | 2.49 | 2.49 | 2.16 | 2.20 |
| Tensile Strength | $kg/mm^2$ | 280 | 350 | 340 | 470 | 245 | 60 |
| Electrical Properties | | | | | | | |
| Dielectric Constant | (1 MHz) | 6.5 | 5.8 | 6.24 | 4.53 | 3.56 | 3.7 |
| Dissipation Factor | (1 MHz) | 0.007 | 0.001 | 0.005 | 0.002 | 0.0005 | 0.0001 |
| Volume Resistivity | $\Omega$ cm | $10^{10}$ | $10^{14}$ | $10^{12}$ | $10^{16}$ | $10^{12}$ | $10^{18}$ |
| Thermal Properties | | | | | | | |
| Coefficient of Linear Expansion | $\times 10^{-6}$ | 8.5 | 5.0 | 7.4 | 5.6 | 3.1 | 0.54 |
| Softening Point | °C. | 710 | 845 | 750 | 970 | 770 | 1670 |
| Specific Heat | cal/g °C. | 0.20 | 0.197 | 0.212 | 0.176 | 0.175 | 0.230 |
| Optical Properties | | | | | | | |
| Index of Refraction | — | 1.52 | 1.547 | 1.541 | 1.523 | 1.47 | 1.459 |

Fibers of magnesium silicate are generally known as asbestos. Asbestos is a general term for natural minerals of silicates in needle-like or fiber-like form. Asbestos of particular significance in the present invention is the chrysotile ($H_4Mg_3Si_2O_9$) form of magnesium silicate. The ratio of length to diameter in chrysotile is greater than 10:1, and some of the lengthy ones extend as long as 5 cm. Chrysotile is an inexpensive mineral chalky white in color which starts losing its constitution water at about 500° C. and retains its fibrous structure even at 800° C.

The needle-like or fiber-like inorganic materials are not limited to calcium metasilicate or fibers or potassium titanate and fibers of magnesium silicate but include such heat resistant inorganic materials as alumina ($Al_2O_3$), silicon carbide (SiC), silicon nitride ($Si_3N_4$), boron nitride (BN), etc. The crystal form of needle-like or fiber-like material also includes other similar crystal forms such as in fine annulation or strip. The needle-like inorganic materials are not limited to those occurring naturally but include man-made, i.e. synthetic inorganic materials as well.

Both the needle-like and the fiber-like inorganic materials mentioned above are superior in heat resistance and strength. However, the temperature at which each can be molded singly is high and if they are respectively calcined at this high temperature, they lose the needle-like or fiber-like form and become inferior in mechanical workability like other sintered inorganic materials.

The vitreous inorganic materials can include any glass material in general. Table 1 shows examples of typical vitreous inorganic materials. The properties of those vitreous materials are shown in Table 2.

The process for preparing the inorganic material of the present invention comprises the steps of kneading and mixing said needle-like inorganic material or fiber-like inorganic material with the vitreous inorganic material in a desired mixing ratio if necessary, with an addition of a third material to obtain a mixture, molding the mixture into a desired shape, and calcining the same at a temperature higher than the softening point of said vitreous inorganic material but lower than the melting point of the needle-like or fiber-like inorganic material.

The vitreous inorganic material is responsible for giving moldability in calcination to the inorganic composite obtained according to the process mentioned above. The needle-like or fiber-like material functions to enhance the mechanical strength, resulting in an inorganic composite having excellent mechanical workability.

The mixing ratio of the needle-like or fiber-like inorganic material with the vitreous inorganic material is determined depending on the use of the final product of inorganic composite. Preferably mixing ratio ranges from 2 to 50 weight % of the needle-like or fiber-like inorganic material against 98 to 50 wt. % of the vitreous inorganic material. If the needle-like or fiber-like inorganic material is given less than 2 wt. % and the vitreous inorganic material exceeds 98 wt. %, the resultant inorganic composite becomes inferior in mechanical strength and thus in the mechanical workability as in the conventional cases. If the needle-like or fiber-like inorganic material exceeds 50 wt. % and the vitreous inorganic material is less than 50 wt. %, workability in sintering and molding becomes deteriorated. Kneading is conducted at normal temperature and pressure until all the inorganic materials are uniformly mixed.

A third material may be added in such a range that said mechanical properties and workability in sintering and molding will not be hampered; more preferably, it is added in an amount less than 20 wt. % in said mixing ratio, e.g., 10 to 20 wt. %. This addition preferably includes materials which improve the moldability or sintering performance of the mixture, or alter the dielectric characteristics of the inorganic composite. If a material which improves the sintering performance is added to the mixture during kneading, it is possible to lower the sintering temperature as well as to obtain an inorganic composite having high density.

For altering the dielectric characteristics of the inorganic composite, a third inorganic material such as titanium dioxide powder which increases the dielectric constant or boric acid which decreases the dielectric constant is employed. It is also possible to add a vitreous inorganic material which has desired dielectric characteristics during kneading. In case an electric insulation in the ordinary range is to be obtained, glass E having the dielectric constant of 5.8 as shown in Table 2 is selected as the vitreous inorganic material. In case a lower dielectric constant is required, glass D having the dielectric constant of 3.56 is selected. For a higher dielectric constant, glass having higher content of PbO, BaO, etc. is selected. Thus, an inorganic composite having desired dielectric constant can be manufactured.

The dielectric characteristics must be altered in such cases as, for example, the insulation of the VLSI to be used in an electronic component with high circuit density where the dielectric characteristics caused by the changes not only in the insulation but in the electric field cannot be ignored.

The kneaded mixture may be molded into various shapes such as plate, rod and pipe depending on the use of the final product. In other words when a small amount of a third material is added at the time of kneading, it gets entangled with the needle-like or fiber-like inorganic material to give so-called "body" to the kneaded mixture, and the resultant mixture easily gives rise to a clay-like plastic material rather than ordinary inorganic powder. In order to give plasticity to an inorganic powder, it is necessary to add an organic polymer thickening agent or plasticizer. However, in the present invention, plasticity can be easily obtained by adding such materials as camphor, paraffin, mineral oil, starch, styrene, methyl alcohol, ethyl alcohol, polyvinyl alcohol, etc. in a small amount, i.e. less than 20% by weight of the mixture, whereby the primary molding can be facilitated. In selecting one of these materials, those which are volatile at normal temperature and pressure are the more preferable. However, this condition does not necessary apply to the case where the mixture is subjected to heating at the time of primary molding or immediately thereafter. Other additives of the cellulose type or water can be added to improve the workability.

Because of the plasticity imparted by the small addition of such materials, shrinkage in size of the molded mixture due to calcination can be reduced. This makes designing of the molded material easier and improves the size precision of the final product.

Moreover, since the plasticity can be easily obtained, various molding/forming methods can be employed for the molding process. The applicable molding methods will be described below.

1. Compression Molding

Compression molding is most frequently used for molding inorganic powder material. In the case of a conventional inorganic powder, cellulose acetate, polyvinyl alcohol and other similar polymer substances are added to improve the strength of the molded material. Sufficient strength can be obtained in the molded material without the addition when the mixture containing the starting materials of the present invention is molded. Water will suffice as an additive, if any at all is used, and it is not necessary to add a polymer.

2. Roll Molding

Roll molding is applicable to materials having plasticity only. For molding the mixture containing the starting materials of the present invention, any one of above-mentioned plasticizing materials is added to the mixture in a small amount and kneaded to give plasticity to the mixture. The resultant mixture may be easily rolled into a sheet using a well known roll molding machine for plastics under conventional molding conditions.

3. Extrusion Molding

Extrusion molding is applicable only to materials having plasticity conventionally as in the case of the roll molding. For molding the mixture containing the starting materials of the present invention, however, any one of said plasticizing materials is added to the mixture in a small amount and kneaded to give plasticity to the mixture. The resultant mixture may be easily molded into a column, pipe or rod using known extrusion machine for plastics under normal molding conditions.

4. Injection Molding

For molding the mixture containing the starting materials of the present invention, any one of said materials is added in a small amount to give plasticity to the mixture. The resultant mixture can be molded into various shapes using known injection machines for plastics under normal molding conditions. It is especially noted that when a cylinder is injected using a cylindrical metal mold, the longer diameter of the needle-like or fiber-like inorganic material can be oriented along the axial direction of the cylinder.

The molded mixture will then be calcined at a temperature higher than the softening point of the vitreous inorganic material and below the melting point of the needle-like or fiber-like inorganic material. Since this calcining temperature is lower than the calcining temperature of ordinary inorganic sintered material, energy in calcination can be saved and the calcining equipment can be simplified. Also, since calcination is conducted at a temperature below the melting point of the needle-like or fiber-like inorganic material, such material is present in the final inorganic composite as a mixture with the isotropic solid vitreous inorganic material with its properties intact. As a result, the inorganic composite suitable for mechanical workings such as cutting, punching, etc. is obtained.

Shrinkage in size of the calcined material at the calcination can be minimized by the presence of the needle-like or fiber-like inorganic material, whereby the size precision can be further improved. This also gives rise to advantages in that cracks and deformation at the time of producing inorganic composite of complicated shapes can be greatly reduced. That effect can be enhanced if pressure is applied in calcining. By controlling the molding conditions so that the longer diameter of the needle-like or fiber-like inorganic material is oriented in a given direction, it is also possible to reduce the shrinkage in size along the orientation of the inorganic material to thereby further improve the size precision. Again, by using a vitreous inorganic material which can be crystallized at the calcining temperature of the present invention, the resultant inorganic composite will have heat resistance against temperatures higher than this calcining temperature.

It is noted that the inorganic composite according to the present invention can be employed as a material for additive process on the substrate for printed circuit boards to form an additive circuit by metal coating the surface by means of electroless plating.

Although the foregoing description refers to the use of inorganic composite as an electric insulation, it is not limited to insulation but is applicable to other fields such as construction materials.

The present invention will be described in more detail by referring to the examples and comparative examples hereinbelow. It should be noted that these examples are given by way of explanation and they limit in no way the scope of the present invention.

The composition can comprise, consist essentially of or consist of the stated materials and the process can comprise, consist essentially of or consist of the recited steps with such materials.

Unless otherwise indicated all parts and percentages are by weight.

Table 3 shows the starting materials and manufacturing conditions employed in examples 1 through 20. The following conditions are common to all the examples 1 through 20 and are therefore omitted in the table:

(i) The vitreous inorganic material is in powder form of 100 mesh.

(ii) A bowl mill is used for kneading.

(iii) The mixture is molded into a sheet of 2 mm in thickness.

(iv) A compression molding machine is used for molding.

(v) Calcination is conducted under an oxidizing atmosphere.

Table 4 shows the starting materials and manufacturing conditions employed in the comparative examples 1 through 3. The mixture is molded into a sheet of 2 mm in thickness as in the examples. The same kneading device and the molding machine as in the above examples are employed.

TABLE 3

| Example | inorganic starting material ① needle-like or fiber-like material name of inorganic substance | average diameter (μm) | average length (μm) | ② vitreous material | ③ the third additive | kneading ratio of mixture by weight ①:②:③ | calcination temp. (°C.) | calcination time (hr) | Remark |
|---|---|---|---|---|---|---|---|---|---|
| 1 | potassium titanate fiber (K₂O.6TiO₃) | 0.1 | 80 | glass E | None | 4:6:0 | 700 | 3 | oriented at the primary molding |
| 2 | | | | glass E | | | | | |
| 3 | | | | glass D | | | | | |
| 4 | | | | glass A | | | | | |
| 5 | | | | quarz | | | 1100 | | |
| 6 | calcium metasilicate (wollastonite) | 8.2 | 110 | glass E | | | 700 | | |
| 7 | | | | glass D | | | | | |
| 8 | | | | glass A | | | | | |
| 9 | magnesium silicate chrysotile (H₄Mg₃Si₂O₉) | 4.6 | 200 | glass E | | | (500, 700) | Note 1 (3, 3) | |
| 10 | | | | glass D | | | | | |
| 11 | | | | glass A | | | | | |
| 12 | hydrate of potassium titanate (2K₂O.11TiO₂.3H₂O) | 0.1 | 130 | glass E | | | (450, 700) | Note 2 (3, 3) | |
| 13 | hydrated titanium dioxide (2TiO₂.H₂O) | 0.1 | 110 | glass E | | | 700 | 3 | |
| 14 | barium titanate (BaTiO₃) | 0.2 | 60 | | | | | | |
| 15 | potassium titanate (K₂O.6TiO₂) | 0.1 | 80 | | boric acid (H₃BO₃) | 3:6:1 | | | |
| 16 | | | | | | | 850 | | |
| 17 | | | | | | | 700 | 24 | |
| 18 | | | | | titanium dioxide powder (TiO₂) | | 750 | 3 | |
| 19 | calcium metasilicate (wollastonite) | 8.2 | 110 | lead glass (PbO: 29.5%) | None | 4:6:0 | 600 | | |
| 20 | calcium metasilicate potassium titanate fiber | 8.2 0.1 | 110 80 | glass E | | Note 3 2:2:6:0 | 700 | | |

Note 1: Calcination at 550° C. for 3 hr with subsequent calcination at 700° C. for 3 hr.
Note 2: Calcination at 450° C. for 3 hr with subsequent calcination at 700° C. for 3 hr.
Note 3: Calcium metasilicate:potassium titanate fiber:glass E = 2:2:6 by weight for mixing and kneading.

TABLE 4

| Comparative Example | starting material ① needle-like or fiber-like inorganic material, or vitreous inorganic material | | ② organic binding | kneading ratio of mixture by weight ①:② | Calcination temp. °C. | Calcination time hr | Remark |
|---|---|---|---|---|---|---|---|
| 1 | potassium titanate fiber (K₂O.6TiO₂) average diameter: average length: | 1 μm 80 μm | paraffin | 97:3 | 1200 | 3 | |
| 2 | calcium metasilicate (wollastonite) average diameter: average length: | 8.2 μm 110 μm | | | 1250 | | |

TABLE 4-continued

| Comparative Example | starting material [1] needle-like or fiber-like inorganic material, or vitreous inorganic material | [2] organic binding | kneading ratio of mixture by weight 1 : 2 | Calcination temp. °C. | Calcination time hr | Remark |
|---|---|---|---|---|---|---|
| 3 | glass E powder | 100 mesh | | 800 | | |

Table 5 shows the properties of the products from examples 1 through 20 and comparative examples 1 through 3.

It is evident from the results shown in Table 5 that:

(a) The dielectric constant is variable depending on the types of vitreous inorganic material to be added to the potassium titanate fiber ($K_2O \cdot 6TiO_2$). (EXAMPLES 1, 3, 4, 5).

(b) Mechanical strength increases and shrinkage along the orientation of the longer diameter decreases if the longitudinal diameter of potassium titanate fiber is oriented in a given direction. (EXAMPLE 2).

(c) In the case of calcium metasilicate or magnesium silicate, the dielectric constant is also variable depending on the types of vitreous inorganic material as is the case mentioned in the foregoing (EXAMPLES 6 THROUGH 11).

(d) Insulation resistance and dissipation factor show a slight drop when glass A is used as the vitreous inorganic material. (EXAMPLES 4, 8, 11).

(e) The hydrates of derivatives of potassium titanate fiber help maintain stable properties as the $H_2O$ molecules are removed at the time of calcination. (EXAMPLES 12 AND 13).

(f) Barium titanate fiber can increase the dielectric constant. (EXAMPLE 14).

(g) Addition of boric acid to potassium titanate fiber decreases the dielectric constant. (EXAMPLE 15).

(h) Alteration in the calcination conditions results in differences in the sintering performance and calcination at higher temperatures is therefore disadvantageous.

Mechanical workability deteriorates. (EXAMPLES 16, 17).

(i) Addition of titanium dioxide powder as a third additive can also increase the dielectric constant. (EXAMPLE 18).

(j) Use of lead glass and the like which has a high dielectric constant as the vitreous inorganic material can result in higher dielectric constant for the whole product. (EXAMPLE 19).

(k) Use of the needle-like and the fiber-like inorganic materials in admixture will present no problems in terms of the properties and is advantageous in terms of the cost. (EXAMPLE 20).

These results indicate that the dielectric characateristics and the insulation resistance can be selected from a wide range depending on the types of starting materials and the ratio of mixture. The resultant inorganic composite had a good mechanical workability.

The ratio of mixture for the starting materials given in Table 5 may be variable within the range of ±10% of the values given to obtain equal results.

The inorganic composites obtained in the comparative examples are inferior in mechanical workability as compared to the examples of the present invention. It was also found that the dielectric characteristics cannot be arbitrarily selected.

TABLE 5

| | insulation resistance ($\Omega$ cm) | dielectric constant (1 MHz) | dissipation factor $\times 10^{-3}$ (1 MHz) | coefficient of thermal expansion $\times 10^{-6}$ | shrinkage at sintering (%) | mechanical workability | modulus of rupture in bending (kg/cm$^2$) | specific gravity (g/cm$^3$) |
|---|---|---|---|---|---|---|---|---|
| Exam. | | | | | | | | |
| 1 | $10^{14}$ | 5.0 | 2.5 | 4.2 | 1.6 | high | 430 | 2.2 |
| 2 | $10^{14}$ | 4.9 | 2.3 | 4.1 | 0.7 | " | 470 | 2.2 |
| 3 | $10^{12}$ | 4.2 | 1.2 | 2.5 | 1.8 | " | 380 | 2.0 |
| 4 | $10^{11}$ | 7.6 | 9.0 | 3.8 | 2.1 | " | 400 | 2.2 |
| 5 | $10^{16}$ | 3.8 | 0.8 | 2.4 | 0.9 | " | 490 | 2.1 |
| 6 | $10^{15}$ | 4.7 | 1.8 | 3.6 | 1.5 | " | 450 | 2.3 |
| 7 | $10^{12}$ | 3.8 | 1.1 | 2.0 | 1.5 | " | 410 | 2.2 |
| 8 | $10^{11}$ | 6.8 | 10.3 | 4.0 | 1.9 | " | 420 | 2.3 |
| 9 | $10^{14}$ | 5.8 | 1.5 | 4.5 | 1.6 | " | 410 | 2.2 |
| 10 | $10^{12}$ | 4.5 | 1.6 | 3.5 | 2.7 | " | 430 | 2.3 |
| 11 | $10^{11}$ | 8.1 | 9.5 | 5.1 | 3.4 | " | 410 | 2.2 |
| 12 | $10^{14}$ | 5.3 | 3.2 | 4.8 | 2.6 | " | 435 | 2.2 |
| 13 | $10^{14}$ | 4.8 | 4.3 | 2.8 | 1.9 | " | 410 | 2.2 |
| 14 | $10^{14}$ | 9.2 | 2.3 | 2.5 | 2.2 | " | 420 | 2.1 |
| 15 | $10^{12}$ | 4.1 | 1.8 | 4.2 | 2.4 | " | 440 | 2.3 |
| 16 | $10^{13}$ | 4.3 | 1.6 | 2.8 | 3.6 | slightly low | 440 | 2.3 |
| 17 | $10^{12}$ | 4.1 | 1.7 | 4.1 | 2.4 | high | 440 | 2.3 |
| 18 | $10^{12}$ | 10.2 | 1.3 | 4.5 | 1.9 | " | 380 | 2.2 |
| 19 | $10^{13}$ | 9.3 | 1.5 | 4.2 | 1.2 | " | 400 | 2.5 |
| 20 | $10^{14}$ | 4.8 | 2.0 | 4.0 | 1.4 | " | 440 | 2.3 |
| Comparative | | | | | | | | |
| 1 | $10^{14}$ | 3.9 | 4.5 | 1.9 | 1.9 | low | | |
| 2 | $10^{14}$ | 4.8 | 1.8 | 6.5 | 1.5 | " | | |
| 3 | $10^{14}$ | 5.9 | 2.3 | 4.2 | 4.6 | " | | |

The present invention will be further explained by way of the following examples.

(EXAMPLE 21)

Potassium titanate fiber ($K_2O \cdot 6TiO_2$) having an average diameter of 0.1 μm and an average length of 80 μm, glass E powder shown in Table 2 and methyl alcohol are mixed in a ratio of 3:6:1 by weight as the starting materials. The mixture is kneaded in a mixer at normal temperature and pressure until all the starting materials are uniformly mixed with one another.

The kneaded mixture is then introduced into a hopper of an extruder to extrude a rod-like molded material 20 mm in diameter from a die. Methyl alcohol content in the rod is removed by volatilization as the rod is left standing for 10 minutes at normal temperature and pressure.

The rod is then introduced into a calcining furnace under an oxidizing temperature and calcined for 1 hour at normal pressure and at the temperature of 700° C., to obtain an inorganic composite in rod shape.

(EXAMPLE 22)

Calcium metasilicate (wollastonite) having an average diameter of 8.2 μm and an average length of 110 μm, glass A powder shown in Table 2 and boric acid ($H_3BO_3$) are mixed in a ratio of 3:6:1 by weight as the starting materials. The mixing is kneaded in the same manner as in Example 21.

The kneaded mixture is charged in a mold, heated at 150° C. and subjected to compression for 15 minutes at 20 kg/cm$^2$ to obtain a sheet 2 mm in thickness and 25 cm × 25 cm in size.

This sheet is then placed on a compressor, pressurized on both surfaces at 100 kg/cm$^2$, heated to 700° C., and maintained at 100 kg/cm$^2$ at 700° C. for 1 hour. The sheet is then spontaneously cooled before removing from the compressor as a sheet-like inorganic composite.

(EXAMPLE 23)

Barium titanate fiber ($BaTiO_3$) having an average diameter of 0.2 μm and an average length of 80 μm, lead glass powder (PbO content 29.5%) and styrene are mixed in a ratio of 2:7:1 by weight as the starting materials. The mixture is kneaded in the same manner as in Example 21.

The mixture is then introduced into a hopper of the injection machine to obtain a disc of 2 mm in thickness and 10 cm in diameter by heating to 150° C. The resultant disc is again heated to 200° C. for 1 hour to remove the styrene and then introduced in a calcining furnace under an oxidizing atmosphere and calcined at 600° C. for 2 hours under normal pressure to obtain a disc-like inorganic composite.

(EXAMPLE 24)

Hydrate of potassium titanate ($2K_2O.11TiO_2.3H_2O$) having an average diameter of 0.1 μm and an average length of 130 μm, glass E powder shown in Table 2 and titanium dioxide powder ($TiO_2$) are mixed in a ratio of 3:6:1 by weight as the starting materials. The mixture is kneaded in the same manner as in Example 21. To the mixture there is then added 25% by weight of water ($H_2O$) and the mixture kneaded by means of three rolls to maintain the viscous state.

The kneaded mixture is then introduced into a hopper of the extruder to extrude a square tube of 10 mm × 10 mm in size and of 1 mm in thickness. The square tube is passed through a tunnel furnace maintained at normal pressure and at 200° C. at a rate of 0.5 m/min. for reheating to disperse the water content. The column is then placed in a calcining furnace under an oxidizing atmosphere to calcine at normal pressure at 450° C. for 1 hour and successively at normal pressure at 700° C. for 3 hours, to obtain a square column-like inorganic composite.

(FEATURES OF EXAMPLE 21-24)

Table 6 shows the properties of the inorganic composites according to Examples 21 through 24.

TABLE 6

| Properties | Example 21 | Example 22 | Example 23 | Example 24 |
|---|---|---|---|---|
| Shrinkage at calcination | 1.6% | 0.7% | 1.7% | 1.3% |
| Specific gravity | 2.3 | 2.6 | 2.5 | 2.2 |
| Mechanical workability | high | high | high | high |

What is claimed is:

1. An inorganic composite of high density comprising (1) a needle-like or fiber-like inorganic material, or mixture thereof, present in an admixture with (2) an isotropic vitreous inorganic material, said needle-like or fiber-like inorganic material maintaining its needle-like or fiber-like form, said composite having been formed by directly bonding material (1) to material (2) by molding and heating to form a composite having a specific gravity of 2.0 to 2.6.

2. An inorganic composite according to claim 1 wherein the vitreous inorganic material has a softening point below the melting point of the needle-like or fiber-like inorganic material.

3. An inorganic composite according to claim 2 which contains 2 to 50% of the needle-like or fiber-like inorganic material (1) and 98 to 50% of the vitreous inorganic material (2) based on the total weight of (1) and (2).

4. An inorganic composite according to claim 3 containing 0 to 20% of the total weight of the composite of a third inorganic material.

5. An inorganic composite according to claim 4 consisting of (1) and (2).

6. An inorganic composite according to claim 4 including a third inorganic material in an amount effective to alter the dielectric characteristics of the inorganic composite.

7. An inorganic composite according to claim 6 wherein the third inorganic material is titanium dioxide powder or boric acid.

8. An inorganic composite according to claim 3 including both a needle-like inorganic material and a fiber-like inorganic material.

9. An inorganic material according to claim 3 including a needle-like inorganic material.

10. An inorganic material according to claim 9 wherein the needle-like material is calcium metasilicate.

11. An inorganic material according to claim 3 including a fiber-like inorganic material.

12. An inorganic material according to claim 11 wherein the fiber-like inorganic material is potassium titanate fibers, barium titanium fibers, strontium titanate fibers, magnesium silicate fibers, titanium dioxide fibers.

13. An inorganic material according to claim 12 wherein the fiber-like inorganic material is potassium titanate fibers or magnesium silicate fibers.

14. An inorganic composite according to claim 3 wherein (1) consists of needle-like calcium metasilicate.

15. An inorganic composite according to claim 3 wherein (1) consists of potassium titanate fibers.

16. An inorganic composite according to claim 3 wherein (1) consists of magnesium silicate fibers.

17. A process for preparing an inorganic composite of high density comprising the steps of:

kneading a mixture containing (1) a vitreous inorganic material with (2) a needle-like or fiber-like inorganic material which does not melt at the softening point of the vitreous inorganic material;

molding the kneaded mixture into a predetermined shape; and calcining the molded material at a temperature above the softening point of the vitreous inorganic material and below the melting point of the needle-like or fiber-like inorganic material to form a composite having a specific gravity of 2.0 to 2.6.

18. A process according to claim 17 wherein the mixture contains 2 to 50% of the needle-like or fiber-like inorganic material (2) and 98 to 50% of the vitreous inorganic material (1) based on the total weight of (1) and (2).

19. A process according to claim 18 wherein there is employed needle-like calcium metasilicate.

20. A process according to claim 18 wherein there is employed potassium titanate fibers or magnesium silicate fibers.

21. A process for preparing an inorganic composite according to claim 18 wherein the mixture to be kneaded includes, in addition to the needle-like or fiber-like inorganic material and the vitreous inorganic material, a third additive which improves the moldability or sintering performance of the mixture or alters the dielectric constant of the inorganic composite, the third addition being present in an amount of not over 20% of the weight of the mixture.

22. A process according to claim 21 wherein the third additive is an organic material which improves moldability and is present in an amount effective to improve the moldability of the mixture.

23. A process according to claim 21 wherein the third additive is a material that improves the sintering performance and is present in an amount effective to improve the sintering performance of the mixture.

24. A process according to claim 21 wherein the third additive is an inorganic material that alters the dielectric constant of the inorganic composition and is present in an amount effective to alter the dielectric constant of the inorganic composite.

* * * * *